US006901631B1

(12) United States Patent
Lin (10) Patent No.: US 6,901,631 B1
(45) Date of Patent: Jun. 7, 2005

(54) HANDLE STRUCTURE

(75) Inventor: Chieh-Wei Lin, Jungli (TW)

(73) Assignee: Delta Electronics, Inc., (TW)

( * ) Notice: Subject to any disclaimer, the term of this patent is extended or adjusted under 35 U.S.C. 154(b) by 19 days.

(21) Appl. No.: 10/615,664

(22) Filed: Jul. 9, 2003

(30) Foreign Application Priority Data

Dec. 13, 2002 (TW) .............................. 91220335 U (51) Int. Cl.[7] .......................... A45C 13/22; A45F 5/10
(52) U.S. Cl. ...................................... 16/110.1; 16/422
(58) Field of Search ....................... 16/422, 429, 110.1, 16/438; 74/528, 543–548; 165/80.1, 80.3; 361/694–695, 361/724–727, 732, 754–756, 759, 798, 801–803; 417/423.14, 424.2; 454/184

(56) References Cited

U.S. PATENT DOCUMENTS

| 5,321,962 | A | * | 6/1994 | Ferchau et al. ............... 70/208 |
| 5,400,473 | A | * | 3/1995 | Delman ........................ 16/429 |
| 5,506,758 | A | * | 4/1996 | Cromwell .................... 361/798 |
| 5,560,082 | A | * | 10/1996 | Vetter .......................... 16/429 |
| 5,926,370 | A | * | 7/1999 | Cromwell .................... 361/700 |
| 5,940,288 | A | * | 8/1999 | Kociecki ..................... 363/144 |
| 6,003,689 | A | * | 12/1999 | Babineau et al. ........ 211/41.17 |
| 6,134,115 | A | * | 10/2000 | Sim et al. .................... 361/747 |
| 6,160,717 | A | * | 12/2000 | Desousa et al. ............ 361/798 |
| 6,185,106 | B1 | * | 2/2001 | Mueller ...................... 361/798 |
| 6,272,005 | B1 | * | 8/2001 | Jensen et al. ............... 361/680 |
| 6,646,883 | B2 | * | 11/2003 | Salinas ........................ 361/727 |

FOREIGN PATENT DOCUMENTS

EP 845563 A1 * 6/1998 ............. E05B 5/00

* cited by examiner

Primary Examiner—Chuck Y. Mah
(74) Attorney, Agent, or Firm—Volpe and Koenig, P.C.

(57) ABSTRACT

A handle structure is provided. The handle structure adapted to secure a case in a frame of an electrical apparatus includes at least a handle, wherein the frame includes a protruding portion extending from the frame. Each of the handles includes a stem portion, an engaging portion pivotally connected to the case and further comprising a recess portion for engagement with the protruding portion of the frame, and a leaf spring structure being set at the other end of the stem portion for securing the case in the frame, wherein the handle is engaged with the case and the case is engaged with the frame when the case is secured in the frame, and the leaf spring structure is used for disengaging the handle from the case when the case is retracted from the frame.

16 Claims, 7 Drawing Sheets

HANDLE STRUCTURE

FIELD OF THE INVENTION

This invention relates to a handle structure of a case, and more particular to a handle structure of a case which has the advantages of a small volume, convenient operation, and simple structure.

BACKGROUND OF THE INVENTION

Figure 1:
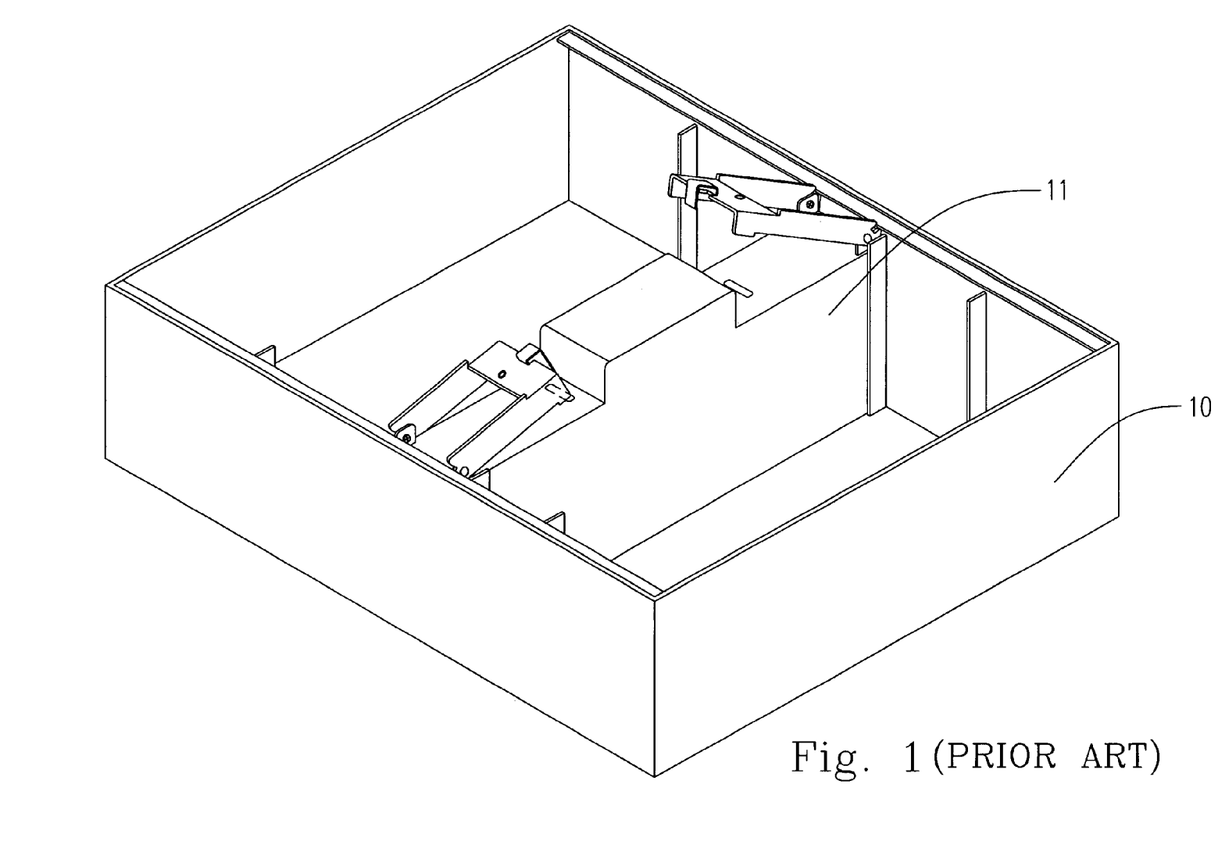
FIG. 1 shows a schematic view of the handle structure of the case and the frame in the prior art.

Generally, as shown in FIG. 1, there are many apparatuses disposed in a frame 10, e.g., power supply etc. Typically, because there usually has fixed partitions in the frame 10 for disposing each apparatus therein, the volume of each apparatus is constrained by the partition space of the frame 10, namely the volume of each apparatus is limited to the partition space of the frame 10. Therefore, it is the main problem in the typical application how to enlarge the useful inner space of each apparatus for containing more and more electronic elements.

Moreover, when each apparatus has been disposed in the frame 10, how to take it out becomes a significant problem. Actually, the volume and weight of each apparatus are always such big and heavy that the apparatus is not easy to take the apparatus out without any handle. Thus, a handle is developed to set on the case 11 of each apparatus for disposing therein and retracting therefrom.

Figure 2:
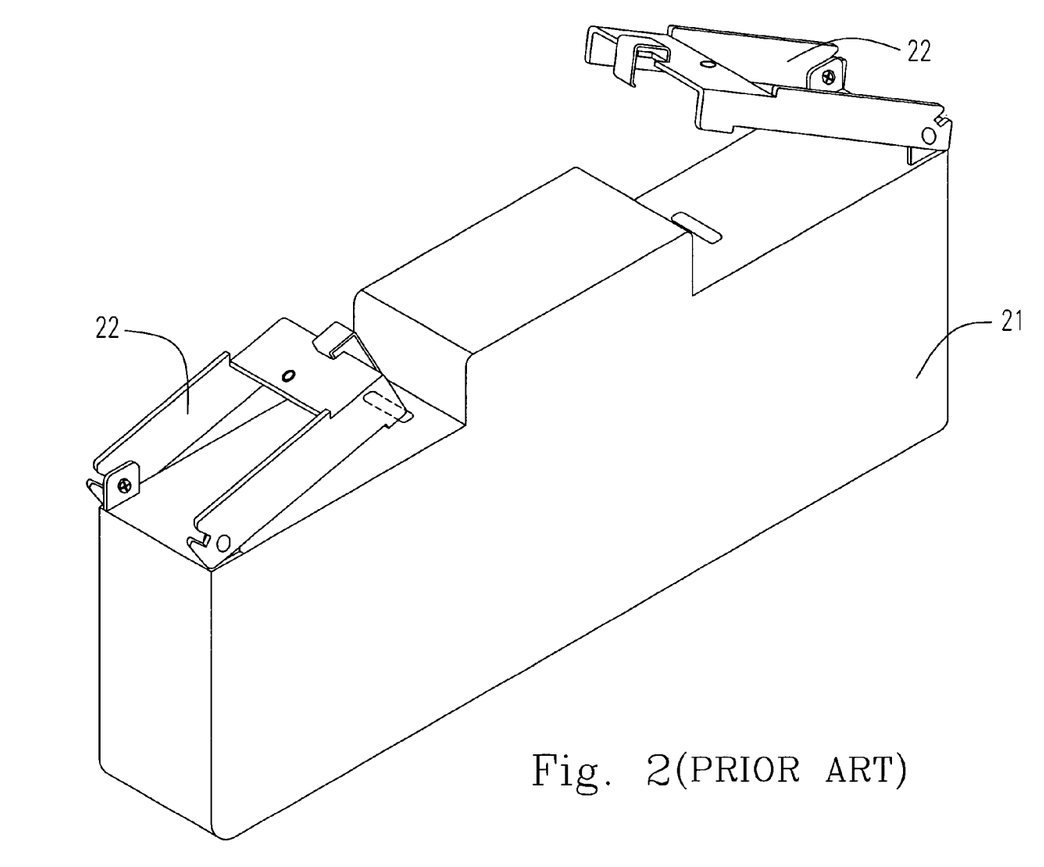
FIG. 2 shows a structural schematic view of the handle structure of the case in the prior art.

Please refer to FIG. 2 which illustrates a handle of a case which is used for disposing the case into a frame in the prior art. As shown in FIG. 2, a case 21 includes two handles 22 which are set at a surface of the case 21, and this handle structure is developed for solving the problems described above. Through the handle structure, the user can easily dispose the case 21 into and take the case 21 out of the frame. However, it is also obvious that this handle structure occupies lots of spaces and two notches must be formed on the case for placing the handle structure. Therefore, the space inside the case will be reduced and the application of the space therein will also be limited. Consequently, this kind of handle structure is actually a special waste and does not conform to the principle of economic, especially on the prerequisite of raising the utility of the space.

Because of the technical defects described above, the applicant keeps on carving unflaggingly to develop a "handle structure of case" through wholehearted experience and research which.

SUMMARY OF THE INVENTION

It is an object of the present invention to provide a handle structure of a case which can be used to easily dispose the case into and take the case out of a frame and the case still may has a maximum usable volume.

It is another object of the present invention to provide a handle structure of a case which includes an integrated formed and a leaf spring structure and the volume of the handle structure may be minimized by means of this leaf spring structure so that the volume inside the case will not need to be reduced.

In accordance with an aspect of the present invention, a handle structure adapted to secure a case in a frame of an electrical apparatus, wherein the frame includes a protruding portion extending from the frame, includes at least a handle, wherein each of the handles includes a stem portion, an engaging portion pivotally connected to the case and further comprising a recess portion for engagement with the protruding portion of the frame, and a leaf spring structure being set at the other end of the stem portion for securing the case in the frame, wherein the handle is engaged with the case and the case is engaged with the frame when the case is secured in the frame, and the leaf spring structure is used for disengaging the handle from the case when the case is retracted from the frame.

Preferably, the leaf spring structure includes a connecting portion for connecting to the stem portion, a first protruding portion for locking the case with the handle, a pressing portion connected to the first protruding portion for receiving a pressure, a backside piece connected to the pressing portion and covering the connecting porting, and two side pieces separately connected to two sides of the backside piece and folded to be parallel to each other and form two smooth sides.

Preferably, the frame is a frame of a power supply apparatus.

Preferably, the stem portion is a thin plate.

Preferably, the case is a case of a power supply.

Preferably, the handles are symmetrically set at two sides of the case for being grips when the case is engaged and disengaged with the frame.

Preferably, the leaf spring structure including the connecting portion, the first protruding portion, the pressing portion, the backside piece, and the two side pieces is integrally formed.

Preferably, the connecting portion is connected to the stem portion through a connecting element.

Preferably, the first protruding portion is a flexible structure.

Preferably, the pressing portion is formed by folding a linking portion located between the backside piece and the first protruding portion.

Preferably, the pressing portion has an arc side cross-section.

Preferably, the case further includes an opening on its surface.

Preferably, the opening is engaged with the first protruding portion when the handle is engaged with the case.

Preferably, the opening further includes a first fixing portion and the first protruding portion further includes a second fixing portion so that the first fixing portion and the second fixing portion are locked to each other after the first protruding portion enters the opening of the case.

Preferably, the first protruding portion is proceeded with compression when the pressing portion suffers the pressure so as to move the backside piece and the two side pieces along a direction of the pressure and relieve engagement between the first fixing portion and the second fixing portion.

In accordance with another aspect of the present invention, a handle structure for engaging and disengaging a first object and a second object, wherein the first object has a surface and the second object has a protruding portion, includes a stem portion, an engaging portion pivotally connected to the first object and further including a recess portion for engagement with the protruding portion of the second object, and a leaf spring structure being set at the other end of the stem portion for securing the first object in the second object, wherein the handle is engaged with the first object and the first object is engaged with the second object when the first object is secured in the second object, and the leaf spring structure is used for disengaging the handle from the first object when the first object is retracted from the second object.

Preferably, the leaf spring structure includes a connecting portion for connecting to the stem portion, a first protruding portion for locking the first object with the handle, a pressing portion connected to the first protruding portion for receiving a pressure, a backside piece connected to the pressing portion and covering the connecting porting, and two side pieces separately connected to two sides of the backside piece and folded to be parallel to each other and form two smooth sides.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 3:
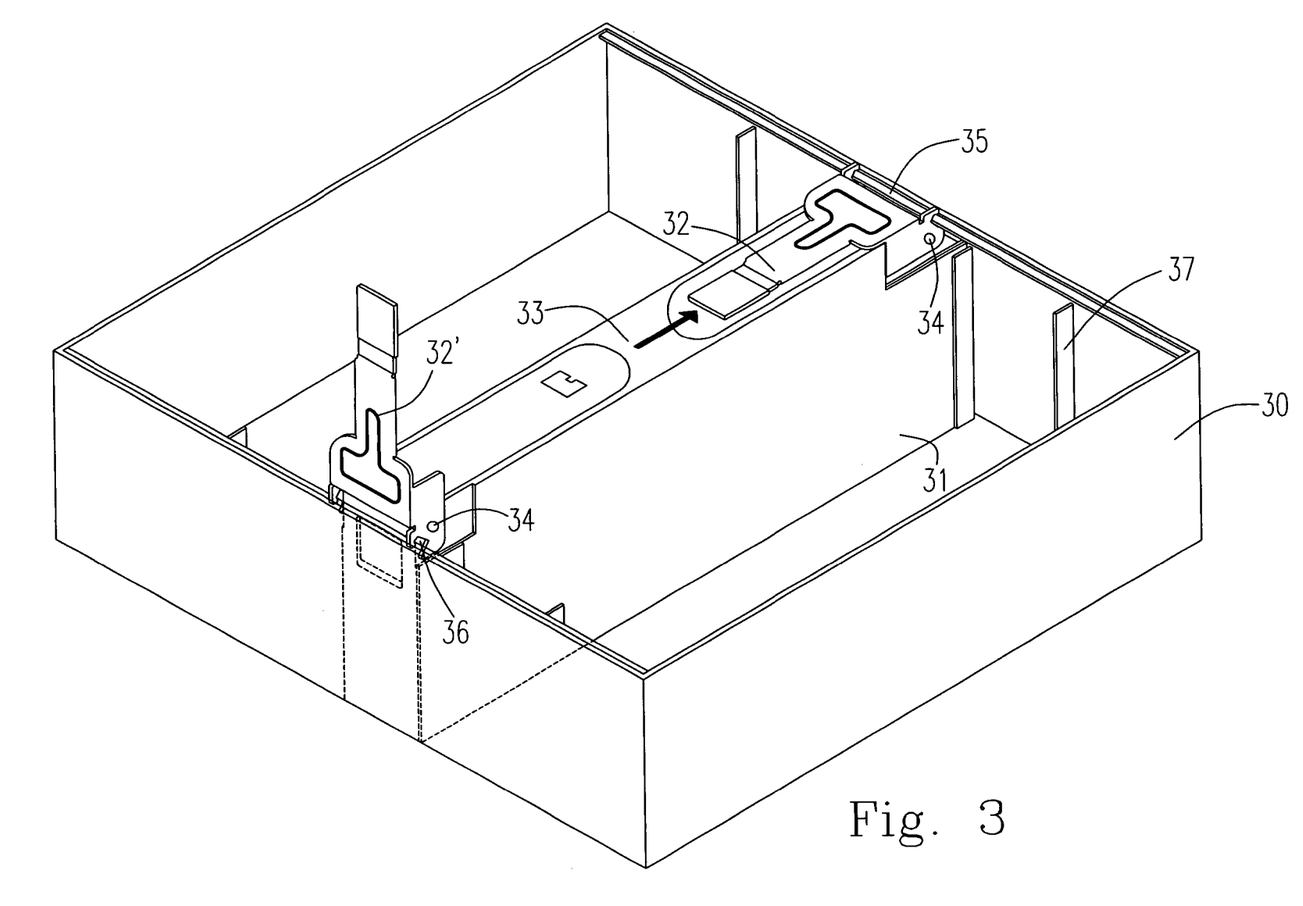
FIG. 3 shows a perspective drawing of the handle structure of the case which is located in a frame in a preferred embodiment according to the present invention.

Please refer to FIG. 3. It illustrates a perspective drawing of the handle structure of the case which is located in a frame in a preferred embodiment according to the present invention. As shown in FIG. 3, a case 31 is positioned in a frame 30, wherein the case 31 includes a surface 33, and two handles 32, 32' are symmetrically set on the surface 33. When the case 31 is inserted into a space between two partitions 37 in the frame 30, a recess portion 36 of the two handles 32, 32' will be engaged with a protruding portion 35 of the frame 30 for successfully helping the combination of the case 31 and the frame 30.

The case 31 and the two handles 32, 32' are connected to each other through a pivot 34 and the two handles 32, 32' rotate around the pivot 34. The two handles 32, 32' can approach the surface 33 of the case 31 until they are parallel to the surface 33 (as the condition of handle 32 shown in FIG. 3) and also can retract from the surface 33 until they are perpendicular to the surface 33 (as the condition of handle 32' shown in FIG. 3).

When the user wants to disengage the handle 32 from the surface 33, it only needs to force an application along the arrow shown in FIG. 3 and simultaneously lift the handle up. When the two handles 32, 32' are substantially perpendicular to the surface 33, the user can easily lift the case 31 up to disengaged from the frame 30 through holding the two handles 32, 32' for completing the separation.

During the processes described above, namely when the two handles 32, 32' are gradually rotated to depart from the surface 33, the recess portion 36 of the handles 32, 32' and the protruding portion 35 of the frame 30 will form a fulcrum and engage to each other. When the handles 32, 32' are rotated to depart from the surface33, the case 31 will therefore be lifted to have an altitude, so that the separation of the case 31 and the frame 30 will become easier to complete.

Figure 4A:
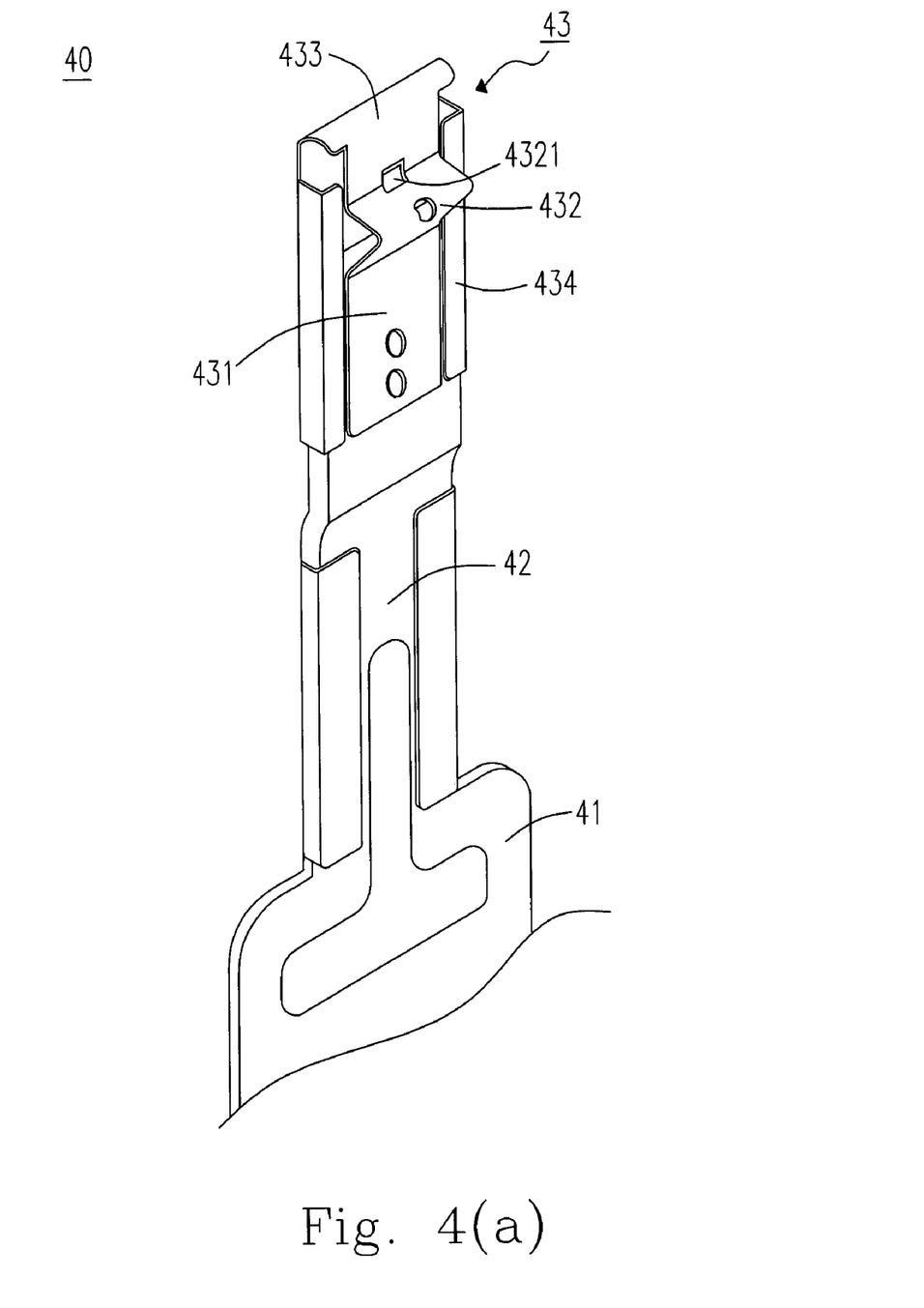
FIG. 4A shows a detail schematic view of the handle structure of the case in a preferred embodiment according to the present invention.
Figure 4B:
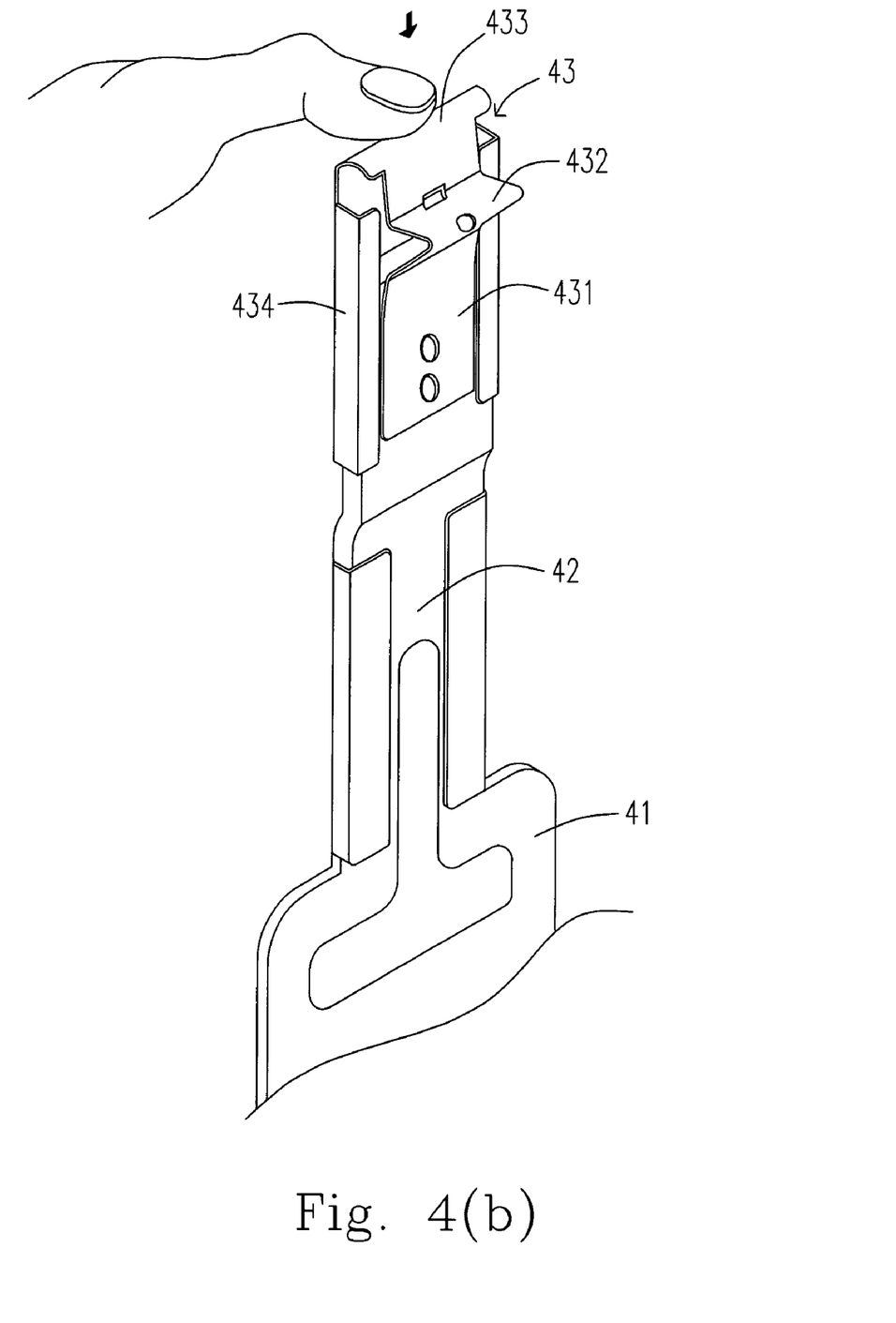
FIG. 4B shows a schematic view of the operation of the handle structure in a preferred embodiment according to the present invention.

Please refer to FIG. 4A which illustrates a detail schematic view of the handle structure of the case in a preferred embodiment according to the present invention. As shown in FIG. 4A, a handle 40 includes an engaging portion 41, a stem portion 42, and a leaf spring structure 43, wherein the leaf spring structure 43 includes a connecting portion 431, a first protruding portion 432, a pressing portion 433, two side pieces 434, and a backside piece (not shown). Moreover, the whole components of the leaf spring structure are integrally formed. The connecting portion 431 is connected to the stem portion 42 and also is the only position for the leaf spring structure 43 to connect to the stem portion 42. And, the pressing portion 433 is the position of the leaf spring structure 43 for receiving a pressure from the user. When the leaf spring structure 43 suffers the pressure on the pressing portion 433, the first protruding portion 432 will proceed with a shrink, as shown in FIG. 4B and the whole leaf spring structure 43 will move toward the position of the connection portion 431 owing to the direction of the pressure. In another word, except the fixed and immovable connecting portion 431 and the shrunk first protruding portion 432, the other portions of the leaf spring structure 43, including the pressing portion 433, the two side pieces 434, and the backside piece, will all be moved by the pressure. Thus, it is obvious that the leaf spring structure 43 is an extremely simple structure and can be formed only through folding one piece of component. At the same time, the stem portion 42 and the fixed-connecting- portion 41 also can be integrally formed. Consequently, when fabricating the whole handle, it only needs to assemble two components, namely it is a design with convenience.

Figure 5:
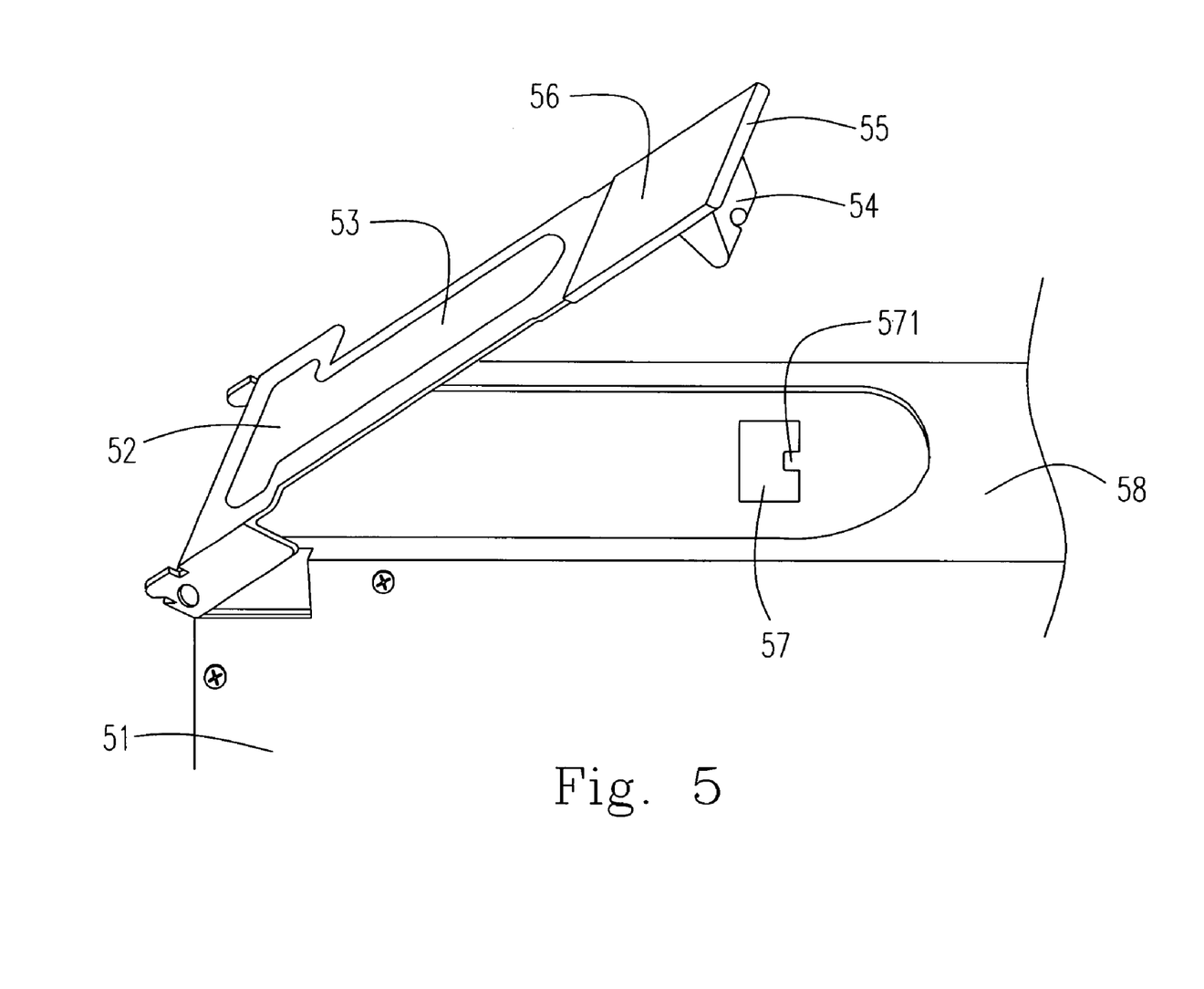
FIG. 5 shows a structural schematic view of a lock and fix relationship between the handle structure and the case in a preferred embodiment according to the present invention.

Furthermore, please refer to FIG. 5 which illustrates a structural schematic view of a lock and fix relationship between the handle structure and the case in a preferred embodiment according to the present invention. As shown in FIG. 5, a surface 58 of a case 51 further includes an opening 57 which is located at a position corresponding to the first protruding portion 54 when the handle stays close to the surface 58. When the case 52 is placed in the frame or is taken out of the frame, the handle can be rotated toward the surface 58 of the case for being hidden. However, for entering the first protruding portion 54 of the handle into the opening 57 on the surface 58, the user have to force an application to the pressing portion as described above so as to shrink the first protruding portion 54 to enter the opening 57.

Furthermore, for fixing the first protruding portion in the opening 57 so as to fix the handle, the opening 57 further includes a first fixing portion 571, and oppositely, the first protruding portion 54 of the leaf spring structure further includes a second fixing portion 4321, as shown in FIG. 4A.

After the first protruding portion 54 is entered the opening 57, the first fixing portion 571 and the second fixing portion 4321 will be engaged to each other so as to fix the handle on the surface 58 of the case 51. When the user wants to utilize the handle to disengage the case from the frame, the user only needs to press the pressing portion 55 for releasing the lock between the first fixing portion 571 and the second fixing portion 4321 and then the handle can be easily rotated to depart from the surface 58. At the same time, the user can simultaneously force the symmetrical handles for lifting up the case 51 easily.

Figure 6A:
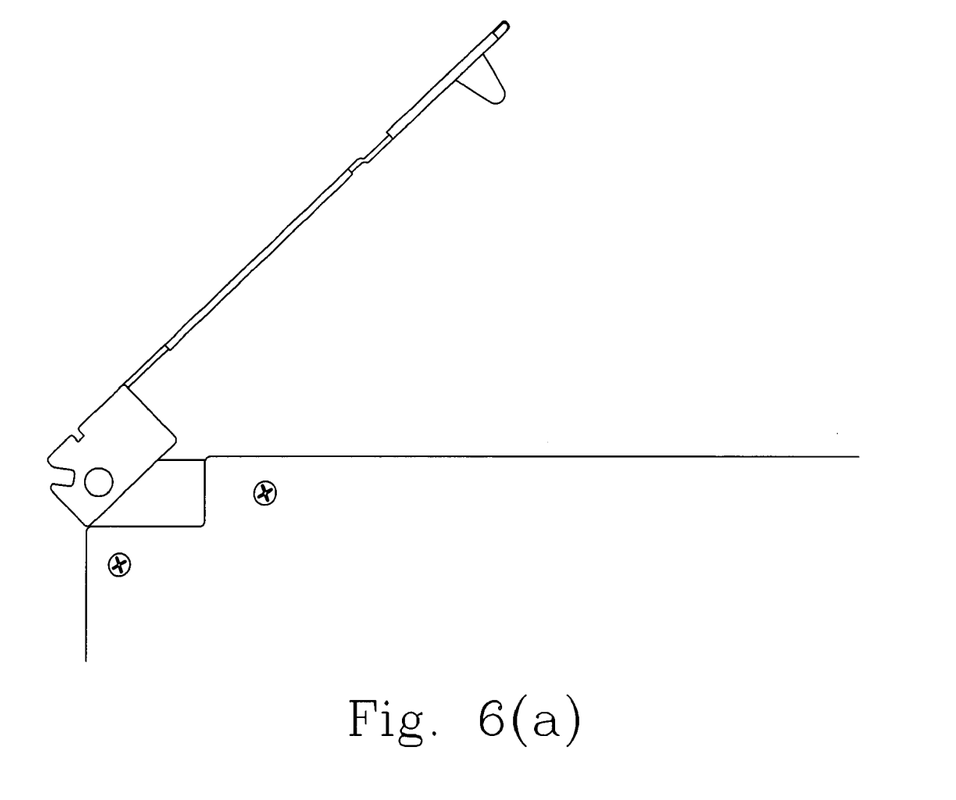
FIGS. 6A~6B show lateral views of the handle structure and the case in a preferred embodiment according to the present invention.
Figure 6B:
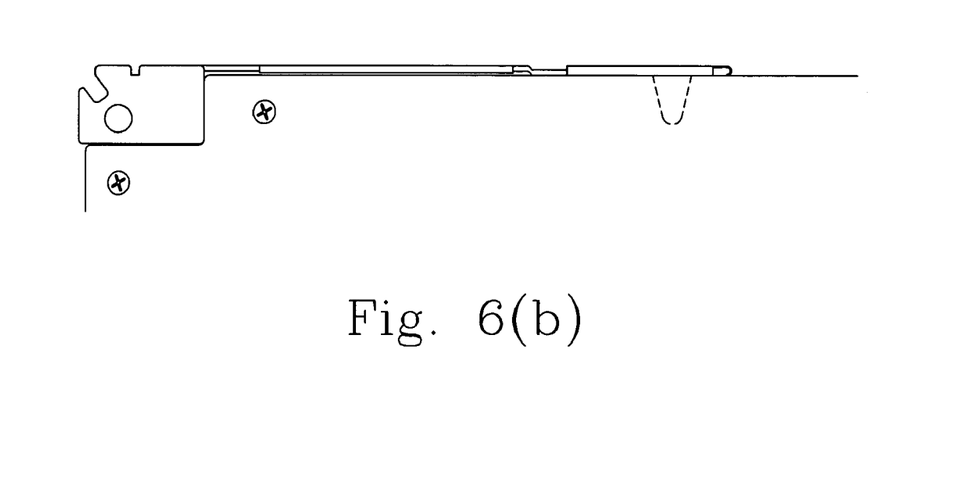

Finally, please refer to FIG. 6A~6B which illustrate the lateral views of the handle structure and the case in a preferred embodiment according to the present invention. As shown in FIGS. 6A~6B, the stem portion of the handle according to the present invention is a thin plate. Because the thickness of the stem portion is pretty slight, when the handle stays close to the surface of the case, the total thickness of the case almost has no increase (as shown in FIG. 6B). Thus, for the case, it will not need to reduce the space inside for setting the handle according to the present invention (namely the case can be a full cuboid) and the apparatus inside the case will not be necessary to particularly reduce the volume. Consequently, the handle according to the present invention is really a design which can save the space.

In view of the aforesaid, in the handle according to the present invention, because the leaf spring structure is a single component, the volume of the stem portion can be minimized. Therefore, the disadvantage in the prior art which occupies too much space can be solved. Simultaneously, the inside volume of the case may be maximized. Furthermore, the present invention not only minimizes the volume but also achieves the lowest cost. Because the present invention only needs the leaf spring structure, which is a single component and integrally formed, and the stem portion and the engaging portion, which are also integrally formed, the cost thereof can be minimized. And, the manufacturing processes of the handle structure according to the present invention are also pretty simple and easy. Consequently, the present invention is really a creative invention and is extremely suitable for industrial production.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A handle structure adapted to secure a case in a frame of an electrical apparatus, wherein said frame comprises a protruding portion extending from said frame, comprising:
    at least a handle, wherein each of said handles comprises:
    a stem portion;
    an engaging portion being set at one end of said stem portion for being pivotally connected to said case and further comprising a recess portion for engagement with said protruding portion of said frame, wherein a leaf spring structure comprises:
    a connecting portion for connecting to said stem portion;
    a first protruding portion for locking said case with said handle;
    a pressing portion connected to said first protruding portion for receiving a pressure;
    a backside piece connected to said pressing portion and covering said connecting portion; and
    two side pieces respectively connected to two sides of said backside piece and folded to be parallel to each other and form two smooth sides;
    said leaf spring structure being set at the other end of said stem portion for securing said case in said frame, wherein said handle is engaged with said case and said case is engaged with said frame when said case is secured in said frame, and said leaf spring structure is used for disengaging said handle from said case when said case is retracted from said frame.

2. The handle structure according to claim 1, wherein said frame is a frame of a power supply apparatus.

3. The handle structure according to claim 1, wherein said stem portion is a thin plate.

4. The handle structure according to claim 1, wherein said case is a case of a power supply.

5. The handle structure according to claim 1, wherein said at least one handle comprising two handles and said handles are symmetrically set at two sides of said case for being grips when said case is engaged and disengaged with said frame.

6. The handle structure according to claim 1, wherein said leaf spring structure including said connecting portion, said first protruding portion, said pressing portion, said backside piece, and said two side pieces is integrally formed.

7. The handle structure according to claim 1, wherein said connecting portion is connected to said stem portion through a connecting element.

8. The handle structure according to claim 1, wherein said first protruding portion is a flexible structure.

9. The handle structure according to claim 1, wherein said pressing portion is formed by folding a linking portion located between said backside piece and said first protruding portion.

10. The handle structure according to claim 1, wherein said pressing portion has an arc side cross-section.

11. The handle structure according to claim 1, wherein said case further comprises an opening on its surface.

12. The handle structure according to claim 1, wherein said case further comprises an opening on its surface.

13. The handle structure according to claim 12, wherein said opening is engaged with said first protruding portion when said handle is engaged with said case.

14. The handle structure according to claim 12, wherein said opening further 12 comprises a first fixing portion and said first protruding portion further comprises a second fixing portion so that said first fixing portion and said second fixing portion are locked to each other after said first protruding portion enters said opening of said case.

15. The handle structure according to claim 14, wherein said first protruding portion is proceeded with compression when said pressing portion suffers said pressure so as to move said backside piece and said two side pieces along a direction of said pressure and relieve engagement between said first fixing portion and said second fixing portion.

16. A handle structure for engaging and disengaging a first object and a second object, wherein said first object comprises a surface and said second object comprises a protruding portion, comprising:
    a stem portion;
    an engaging portion being set at one end of said stem portion for being pivotally connected to said first object and further comprising a recess portion for engagement with said protruding portion of said second object; and a leaf spring structure being set at the other end of said stem portion for securing said first object in said second object, wherein said leaf spring structure comprises:

a connecting portion for connecting to said stem portion;

a first protruding portion for locking said case with said handle;

a pressing portion connected to said first protruding portion for receiving a pressure;

a backside piece connected to said pressing portion and covering said connecting portion; and two side pieces respectively connected to two sides of said backside piece and folded to be parallel to each other and form two smooth sides, wherein said handle is engaged with said first object and said first object is engaged with said second object when said first object is secured in said second object, and said leaf spring structure is used for disengaging said handle from said first object when said first object is retracted from said second object.

* * * * *